United States Patent
Higashino

(10) Patent No.: US 6,622,280 B1
(45) Date of Patent: Sep. 16, 2003

(54) INFORMATION PROCESSING APPARATUS AND METHOD AND DISTRIBUTION MEDIUM

(75) Inventor: Satoru Higashino, Tokyo (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 09/257,861

(22) Filed: Feb. 26, 1999

(30) Foreign Application Priority Data

Mar. 4, 1998 (JP) .......................................... 10-051771

(51) Int. Cl.[7] ...................... H03M 13/33; H03M 13/41; G11B 20/14; G11B 20/18
(52) U.S. Cl. ........................................ 714/789; 714/795
(58) Field of Search ................................ 714/775, 789, 714/795

(56) References Cited

U.S. PATENT DOCUMENTS

| | | | | |
|---|---|---|---|---|
| 5,243,605 A | * | 9/1993 | Lekmine et al. ............... | 371/43 |
| 5,623,474 A | * | 4/1997 | Oshio et al. ................. | 369/124 |
| 5,625,505 A | * | 4/1997 | Ohmori et al. ............... | 360/46 |
| 5,689,488 A | * | 11/1997 | Yamaguchi ................... | 369/59 |
| 5,796,693 A | * | 8/1998 | Taguchi et al. ............... | 369/59 |
| 5,905,601 A | * | 5/1999 | Tsunoda ...................... | 360/51 |
| 5,949,357 A | * | 9/1999 | Fitzpatrick et al. ........... | 341/68 |
| 6,052,072 A | * | 4/2000 | Tsang et al. .................. | 341/59 |
| 6,097,561 A | * | 8/2000 | Wakefield et al. ............ | 360/51 |
| 6,104,324 A | * | 8/2000 | Kim ........................... | 341/58 |

* cited by examiner

*Primary Examiner*—Stephen M. Baker
(74) *Attorney, Agent, or Firm*—Sonnenschein, Nath & Rosenthal

(57) ABSTRACT

It is an object to save a circuit scale and simultaneously improve sync-byte pattern detecting performance. A Viterbi detecting circuit executes first the detecting operation without relation to time limitation. A sync-byte detecting circuit detects the sync-byte from the detection result supplied from a path memory built in the Viterbi detecting circuit and also outputs the detected signal to switches and Viterbi detecting circuit in the timing to start detection of user data. The Viterbi circuit initializes (resets) the path memory and path metric corresponding to the detected signal supplied from the sync-byte detecting circuit and also starts subsequently the trellis Viterbi detection accompanied by the time limitation of the trellis path to the data supplied from the switch.

3 Claims, 7 Drawing Sheets

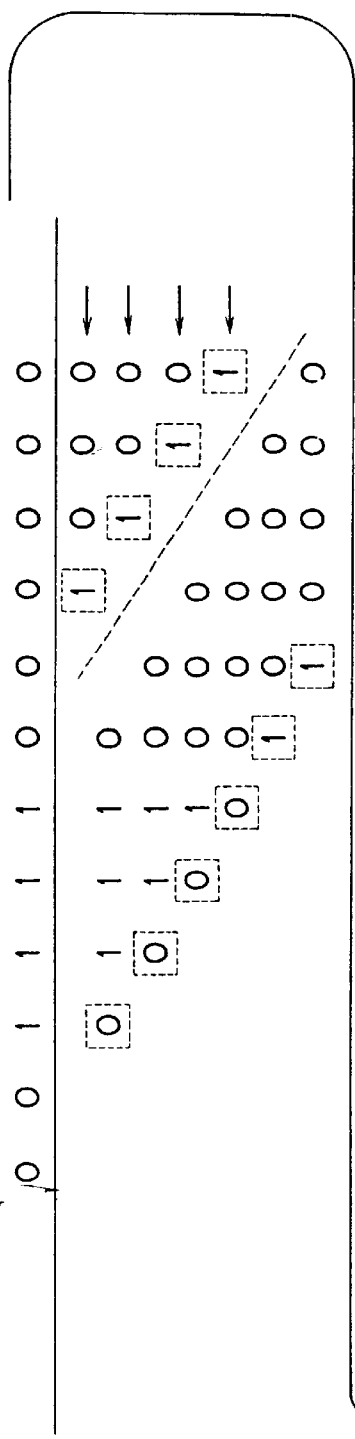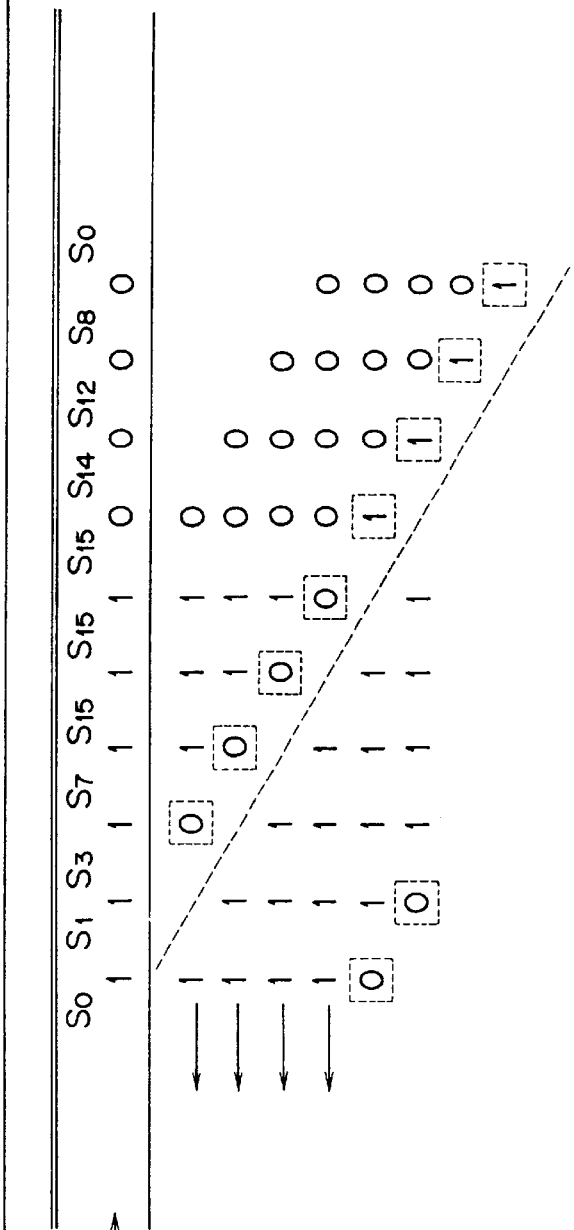
FIG. 6

INFORMATION PROCESSING APPARATUS AND METHOD AND DISTRIBUTION MEDIUM

RELATED APPLICATION DATA

The present application claims priority to Japanese Application No. P10 051771 filed Mar. 4, 1998 which application is incorporated herein by reference to the extent permitted by law.

BACKGROUND OF THE INVENTION

1. Field of the Invention

The present invention relates to an information processing apparatus and method and a distribution medium and particularly to an information processing apparatus and method and a distribution medium in which the heading code of the code string to be detected and such code string can surely be detected without increase in the scale of circuit on the occasion of detecting the code string through combination of equalization suitable to the transmission line such as the partial response equalization and the maximum likelihood decoding.

2. Description of the Prior Art

It is required for a digital communication apparatus and a digital recording/reproducing apparatus to transmit or record data in the density as higher as possible. For this purpose, the PRML (Partial Response Maximum Likelihood) system for detecting(decoding) data string (code string) by combination of the equalization suitable to the transmission path such as partial response equalization (for example, the equalization of sampling waveform for convolution of code) and the maximum likelihood decoding (detection) is well known. As the maximum likelihood decoding, the Viterbi detection (decoding) is used.

In such PRML system, as a method for realizing detection resistive to noise or distortion, a data modulation process which is called the MTR (Maximum Transition Run) encoding (hereinafter referred to as the trellis encoding) has been proposed in which encoding is performed before recording of data while the partial response equalization is introduced as it is. According to this system, the code-to-code distance (Euclidean distance) becomes large to realize the detection resistive to noise or distortion.

Moreover, the time varying MTR trellis encoding, for example, is known, in which the code-to-code distance is increased and the encoding rate has much more improved by executing the MSN (Matched Spectral Null) trellis encoding method to conduct the trellis encoding using the MSN code which can increase the code-to-code distance by giving status to the code to realize matching between Null of power density function of code and Null of frequency characteristic of PRML and also executing the trellis encoding method using the time varying MTR code in which the code is limited depending on the time (channel clock).

Here, the detecting circuit (trellis Viterbi detecting circuit) for detecting (decoding) the code string encoded by the encoding process having time limitation such as the MSN trellis encoding and time varying MTR trellis encoding method such as the MSN trellis encoding and time varying MTR trellis encoding cannot result in the correct detection result if the code string to be detected is not detected from the heading code. Therefore, a pattern (hereinafter referred to as sync-byte pattern) is added to indicate the heading code of the code string and thereby, the detecting circuit (trellis Viterbi detecting circuit) starts the detecting operation (decoding operation) of the code string by detecting this sync-byte pattern.

However, since this sync-byte pattern is not given the time limitation, status and path structure are different for detection of the synch-byte pattern from those of the case where the code string having the time limitation such as the time varying MTR code string is detected. Therefore, a detecting circuit for the sync-byte pattern has to be prepared in addition to the trellis Viterbi detecting circuit, generating a problem that the circuit field increases.

The present invention has been proposed considering such background explained above and therefore the present invention is intended to always and surely detect the sync-byte pattern.

SUMMARY OF THE INVENTION

According to one aspect of the present invention, an information processing apparatus of the present invention is characterized in comprising a detecting means for detecting a code string encoded depending on a rule including a time limitation, an adding means for adding the pattern indicating a heading code of the code string to the stage preceding the code string and a switching means for switching the modes between a first mode for executing the detecting operation by the detecting means without relation to the rule including the time limitation and a second mode for executing the detecting operation by the detecting means depending on the rule including the time limitation, whereby the switching means switches the mode of the detecting means to the first mode in order to detect, with the detecting means, the pattern added by the adding means and also to the second mode in order to detect, by the detecting means, the code string.

According to another aspect of the present invention, an information processing method of the present invention is characterized in comprising a detecting step for detecting a code string decoded depending on a rule including a time limitation, an adding step for adding the pattern indicating a heading code of the code string to the stage preceding the code string and a switching step for switching a operation mode between a first mode to conduct the detecting operation without relation to the rule including the time limitation in the detecting step, and a second mode to conduct the detecting operation depending on the rule including the time limitation in the detecting step, whereby, in the switching step, when the pattern added in the adding step is detected in the detecting step, the detection step mode is switched to the first mode and when the code string is detected in the detecting step, the detecting step mode is switched to the second mode.

According to the other aspect of the present invention, a distribution medium of the present invention is characterized in having recorded thereupon a computer-readable program including a detecting step for detecting a code string decoded depending on a rule including a time limitation, an adding step for adding the pattern indicating a heading code of the code string to the stage preceding the code string and a switching step for switching a mode of operation between a first mode to conduct the detecting operation without relation to the rule including the time limitation in the detecting step, and a second mode to conduct the detecting operation depending on the rule including the time limitation in the detecting step, whereby, in the switching step, when the pattern added in the adding step is detected in the detecting step, the detection step mode is switched to the first mode and when the code string is detected in the detecting step, the detecting step mode is switched to the second mode.

According to the aspects of the present invention, in the information processing apparatus, information processing method and distribution medium of the present invention, when the pattern indicating the heading code of the code string is detected, the operation mode is switched to the first mode to conduct the detecting operation without relation to the time limitation and when the code string is detected, the operation mode is switched to the second mode to conduct the detecting operation depending on the time limitation.

BRIEF DESCRIPTION OF THE DRAWINGS

FIG. 6 is a diagram for explaining an error pattern.

DETAILED DESCRIPTION OF THE PREFERRED EMBODIMENT

The preferred embodiments of the present invention will be explained below but characteristics of the present invention will be described by adding the corresponding embodiments (however, only an example) within the parentheses given after each means in view of making clear the correspondence between each means of the present invention and the embodiments. This description, however, does not mean to be limited to the description of each means.

The information processing apparatus according to one aspect is characterized in comprising a detecting means (for example, Viterbi detecting circuit 44 of FIG. 3) for detecting the code string encoded depending on the rule including the time limitation, an adding means (for example, format data generating circuit 14) for adding the pattern indicating the heading code of the code string to the preceding stage of the code string and a switching means (for example, sync-byte detecting circuit 46 of FIG. 3) for switching the operation mode between the first mode for conducting detecting operation without relation to the time limitation and the second mode for conducting detecting operation depending on the time limitation, whereby the switching means switches the operation mode of the detecting means to the first mode when the detecting means detects the pattern added by the adding means and to the second mode when the detecting means detects the code string.

Figure 1:
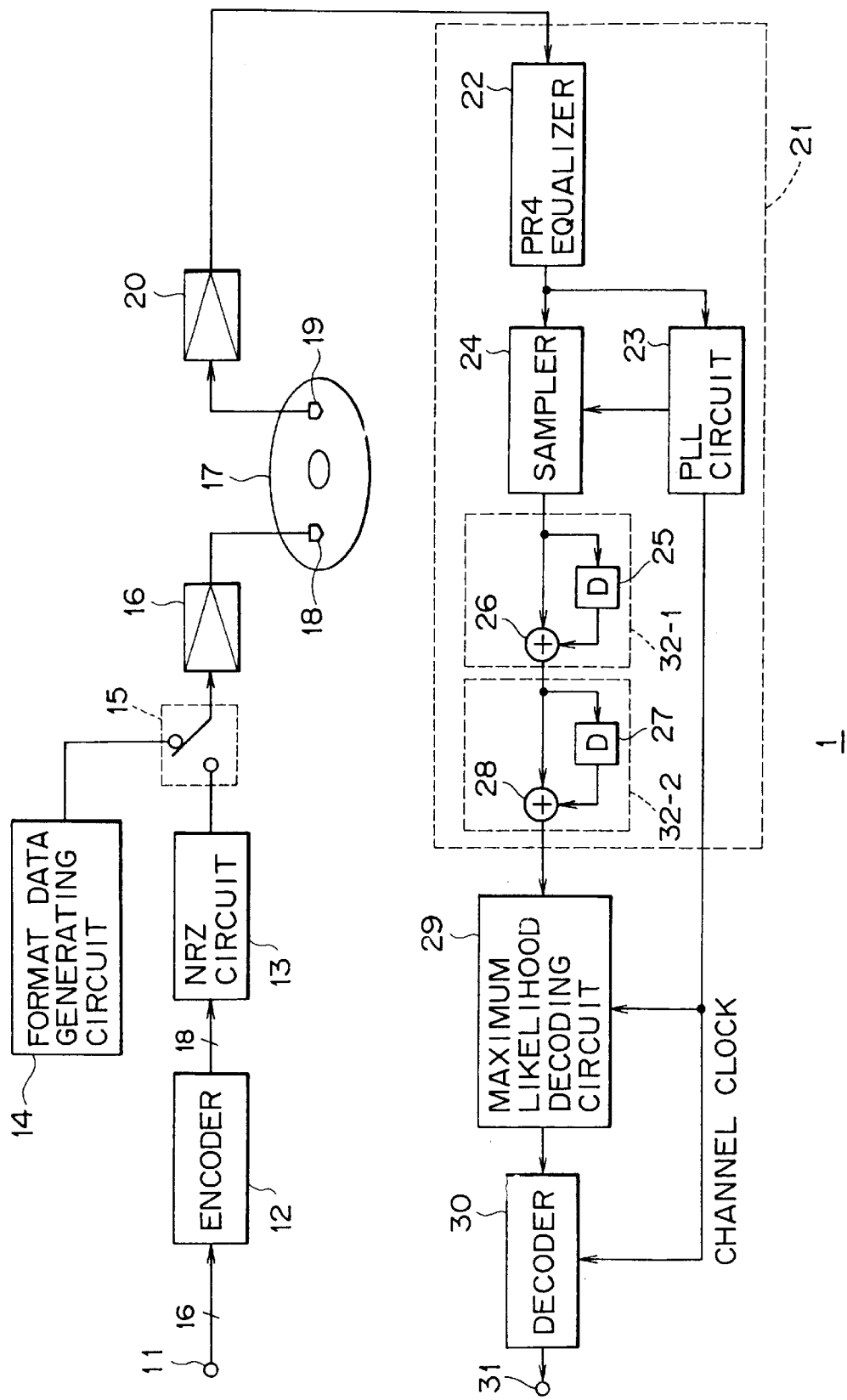
FIG. 1 is a block diagram showing an example of structure of a preferred embodiment of a digital magnetic disk recording/reproducing apparatus to which the information processing apparatus of the present invention is applied.

FIG. 1 shows an example of structure of a digital magnetic disk recording/reproducing apparatus to which the information processing apparatus of the present invention is applied. In this digital magnetic disk recording/reproducing apparatus 1, E2PR4 (Extended Extended Partial Response Class 4) should be applied as the partial response. The user data string (for example, data string of 16 bits) to be recorded as the input to the terminal 11 is supplied to an encoder 12. The encoder 12 executes the time varying MTR trellis encoding process for the user data supplied from the terminal 11 and then outputs the user data string encoded to the time varying MTR code string of 18 bits to the NRZ circuit 13. The NRZ circuit 13 executes the NRZ (Non Return to Zero) process for the user data string supplied from the encoder 12.

The format data generating circuit 14 generates the VFO pattern (VFO Sync pattern) for frequency and phase matching of the VFO (Variable Frequency Oscillator) comprised in the PLL circuit 23, sync-byte pattern indicating the heading code (detection starting position to start detection of user data by the Viterbi detecting circuit 44) of the user data string and application equalizing training pattern (Adaptive EQ Training pattern) for training of the equalizing characteristic in the E2PR4 equalizer and also changes over the switch 15 to provide the data sequence in which the user data string output from the NRZ circuit 18 after the VFO pattern, sync-byte pattern and application equalizing training pattern becomes continuous. An amplifier 16 amplifies the data string (VFO pattern, sync-byte pattern, application equalizing training pattern and user data string) output from the switch 15 to record the data string to a recording medium 17 (for example, magneto-optical disk) using a recording head 18.

A reproduction head 19 reproduces data string from the recording medium 17 and then outputs this data string to an amplifier 20. The amplifier 20 amplifies the data string reproduced by the reproduction head 19 and then outputs the data to an E2PR4 equalizer 21.

Here, when a unit delay time of the channel clock CK is defined as D, the characteristic of the E2PR4 equalizer can be expressed by the following interference polynomial.

$$(1-D)(1+D)^3 \tag{1}$$

Here, indicates the power. The formula (1) can also be expressed by the following formula (2).

$$(1-D)(1+D)(1+D)^2 \tag{2}$$

Namely, it can be understood that the E2PR4 equalizer 21 is mainly structured by the PR4 equalizer 22 and digital filters 32-1, 32-2 of two stages. This E2PR4 equalizer 21 can also be formed in the application equalization type.

In the E2PR4 equalizer 21, the PR4 equalizer 22 executes the partial response equalization (PR4 equalization) using the E2PR4 to the data string supplied from the amplifier 20 and then outputs the equalized waveform to the PLL circuit 23 and a sampler (sampling circuit) 24. The PLL circuit 23 extracts the channel clock CK from the output waveform (equalized waveform) of the PR4 equalizer and then outputs this channel clock CK to the sampler 24, maximum likelihood decoding circuit 29 and decoder 30. These sampler 24, maximum likelihood decoding circuit 29 and decoder 30 are designed to operate conforming to the channel clock CK supplied from the PLL circuit 23. The sampler 24 (sampling circuit) samples the equalized waveform supplied from the PR4 equalizer 22 conforming to the channel clock CK supplied from the PLL circuit 23.

In the stage after the sampler 24, the digital filters 32-1, 32-2 are cascade-connected. The digital filter 32-1 is structured by a unit delay element (D) 25 and an adding circuit 26 enough to the channel clock CK, while the digital filter 32-2 is structured by a unit delay element 27 and an adding circuit 28.

The maximum likelihood decoding circuit 9 detects the sync-byte pattern (heading code of the user data string) for the output from the E2PR4 equalizer 21 and thereafter executes the maximum likelihood decoding process of the user data string and then outputs the user data string decoded by the maximum likelihood decoding method to the decoder 30. The decoder 30 is set in the conjugate relation with the encoder 16 and decodes the code string output from the maximum likelihood decoding circuit 29 and outputs the decoded code string via the output terminal 31.

Figure 3:
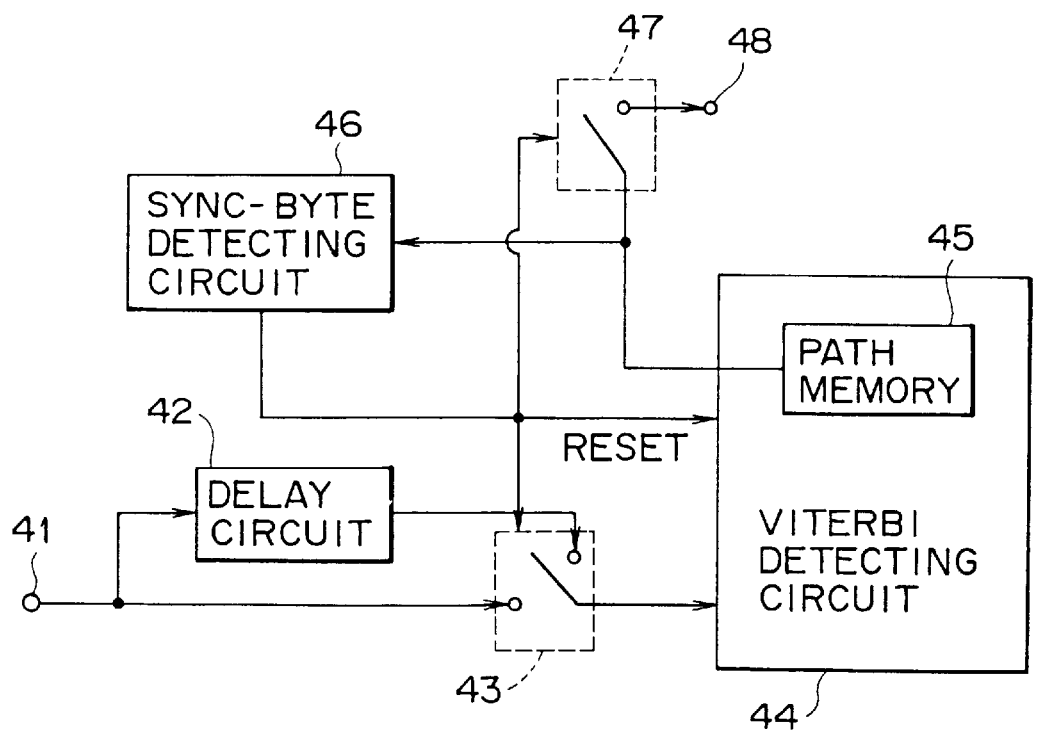
FIG. 3 is a block diagram showing an example of structure of the maximum likelihood decoding circuit of FIG. 1.

FIG. 3 shows an example of detail structure of the maximum likelihood decoding circuit 29. In this example, the data string from the E2PR4 equalizer 21 is supplied to a delay circuit 42 and a switch 43 via the terminal 41. The delay circuit 42 delays the input data string as much as the length (for example, 32 bits) of a path memory 45 comprised in the Viterbi detecting circuit 44 and then outputs the data string to the switch 43. The switch 43 switches the data strings supplied from the terminal 41 and the delay circuit 42 and then outputs the switched data string to the Viterbi detecting circuit 44 depending on the signal supplied from the sync-byte detecting circuit 46. The Viterbi detecting circuit 44 executes the Viterbi detection for the input data string. The path memory 45 is capable of storing a temporary judging value until the detection result of the Viterbi detecting circuit 44 is defined and also outputs the defined detecting result to the sync-byte detecting circuit 46 or switch 47.

The sync-byte detecting circuit 46 detects the sync-byte from the detection result supplied from the path memory 45 and outputs the detection signal to the switch 43, switch 47 and Viterbi detecting circuit 44 in the timing to start detection of the user data string. The switch 43 is switched to select an output from the delay circuit 42 in the timing that the detected signal is supplied from the sync-byte detecting circuit 46, while the switch 47 is switched to output the data (detection result) from the path memory 45 to the terminal 48 in the timing that the detected signal is supplied from the sync-byte detecting circuit 46. Moreover, the Viterbi detecting circuit 44 initializes (resets) the path memory 45 and path metric corresponding to the detected signal from the sync-byte detecting circuit 46 and subsequently starts the trellis Viterbi detection with a time limitation of the trellis path for the data supplied from the switch 43.

Namely, the Viterbi detecting circuit 44 executes first the detecting operation in such a mode that the time limitation is not given to the trellis path, while the sync-byte detecting circuit 46 detects, in this timing, the sync-byte pattern from the detection result of the Viterbi detecting circuit 44. Upon detection of the sync-byte pattern, the sync-byte detecting circuit 46 outputs the detected signal to the switch 43, switch 47 and Viterbi detecting circuit 44 in such a timing that the user data string should be input to the Viterbi detecting circuit 44 (the timing that the user data string should be detected). The Viterbi detecting circuit 44 initializes, corresponding to this process, the path memory 45 and path metric and subsequently starts trellis Viterbi detection in the mode accompanied by the time limitation on the trellis path. Thereby, both sync-byte pattern not given the time limitation and the user data string (time varying MTR code string) having the time limitation can be detected by the Viterbi detecting circuit 44.

Figure 2:
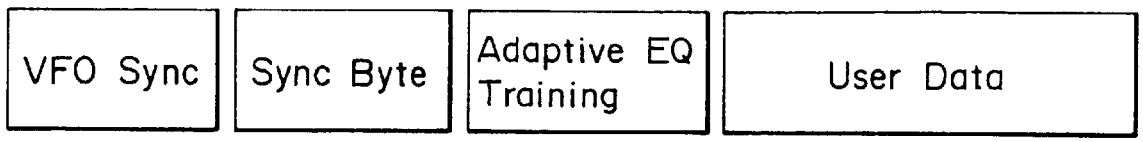
FIG. 2 is a diagram for explaining data sequence in unit of sector.
Figure 4:
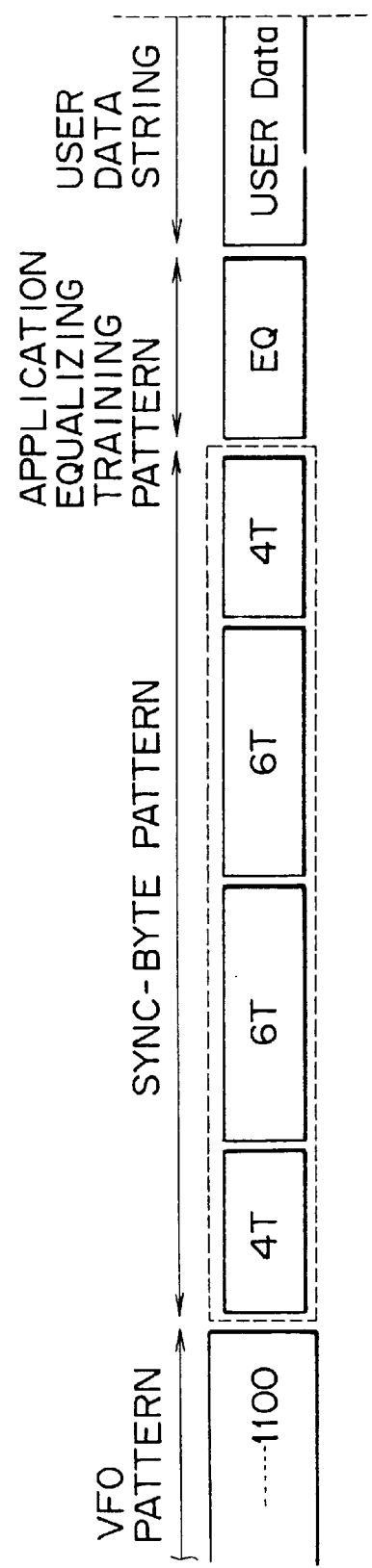
FIG. 4 is a diagram for explaining the sync-byte pattern.

Here, the VFO pattern, sync-byte pattern and application equalizing training pattern shown in FIG. 2 are formed as the code not including the code for three continuous transitions and the Hamming distance between the VFO pattern and sync-byte pattern is set, for example, to four (4). The VFO pattern is defined as the pattern expressed by { . . . 001100110011 . . . } with the NRZ notation, while the sync-byte pattern is defined as the pattern expressed by {10001000001000001000} with the NRZ notation, namely as the pattern of 20 bits in which the bit unit becomes 4T, 6T, 6T, 4T considering the continuity with the VFO pattern as shown FIG. 4. Moreover, the application equalizing training pattern is defined as the pattern of 36 bits in which the bits are sequentially arranged as 2T, 7T, 4T, 5T, 8T, 1T, 3T, 6T expressed by {101000000100010000100000000100100000} with the NRZI notation.

Figure 5:
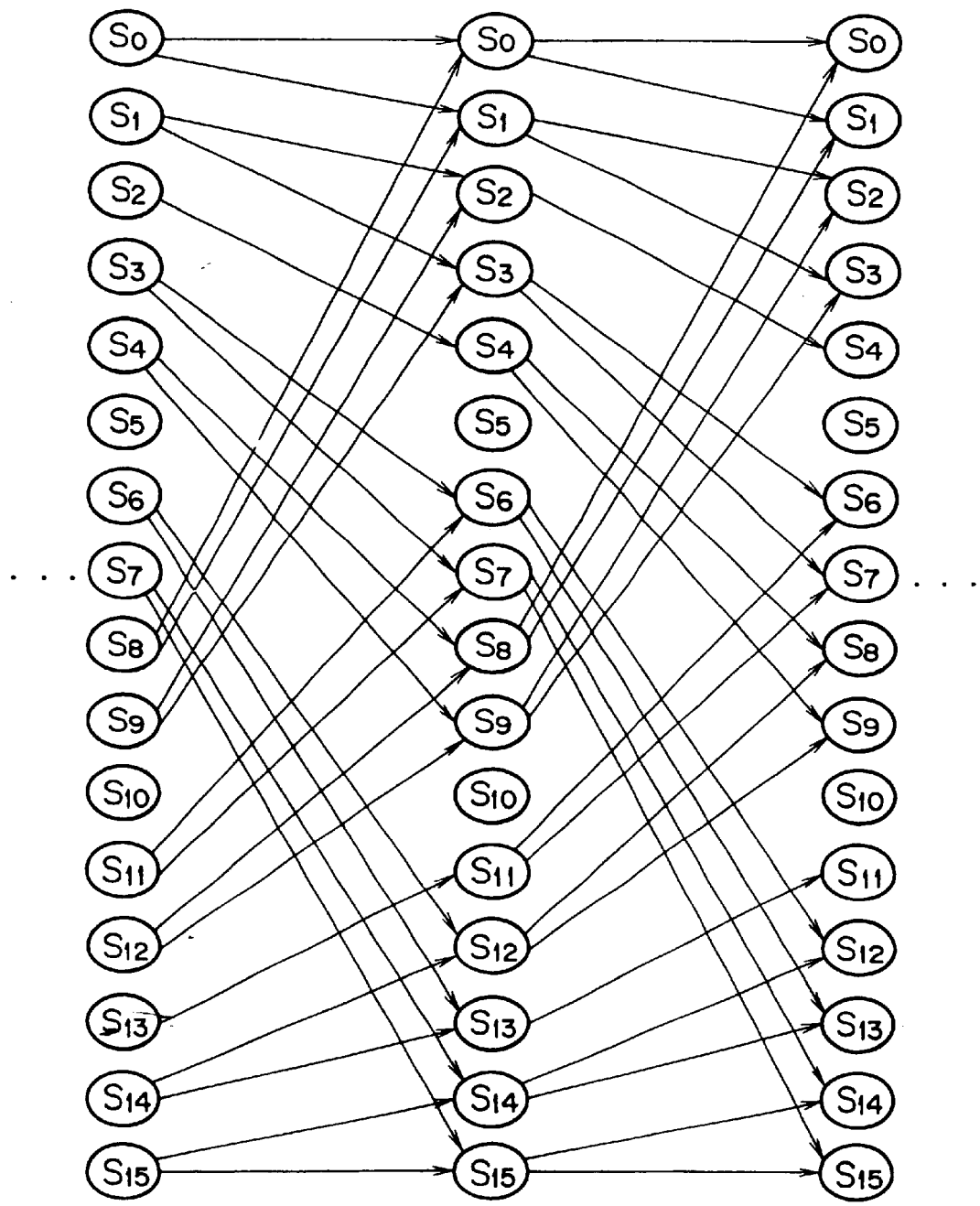
FIG. 5 is a diagram showing an example of a trellis diagram used in the Viterbi detecting circuit.

Moreover, the VFO pattern, sync-byte pattern and application equalizing training pattern are defined not to include the code of three continuous transitions. Namely, these patterns satisfy the conditions of the MTR code. Therefore, the Viterbi detecting circuit 44 detects, as shown in FIG. 5, respective patterns and user data string depending on the trellis structure (only a part is indicated in the figure) for MTR code detection. Thereby, the minimum code-to-code distance (Euclidean distance) can be set to $\sqrt{10}$ for detection of each pattern.

Since the sync-byte pattern is set as the pattern explained above, an error bit (indicated as the hatched area in the figure) in which the code-to-code distance is isolated as much as $\sqrt{10}$ can be set to 1 bit in the respective condition (respective condition corresponds to the condition of the trellis structure shown in FIG. 5). Therefore, probability of erroneous detection can be lowered.

The Viterbi detecting circuit 44 is structured to correct errors up to two errors because the Hamming distance of the VCO pattern and sync-byte pattern is four (4). It is because when the second minimum code-to-code distance is $\sqrt{12}$, correction is possible since simultaneous generation of two bits may be considered.

The sync-byte detecting circuit 46 compares, as explained above, the bit string detected by the Viterbi detecting circuit 44 with the sync-byte and detects the error within two bits as the sync-byte.

By the way, when the Viterbi detecting circuit 44 detects the time varying MTR code as the user data string depending on the trellis structure shown in FIG. 5, the correct detection result cannot be obtained in a certain case because the path covering all time varying MTR codes is not prepared. Therefore, the application equalizing training pattern is defined in the bit length longer than that which can be stored by the path memory 45. In the preferred embodiment of the present invention, the bit length of the path memory 45 is set to 32 bits and the application equalizing training pattern is set to 36 bits. Therefore, an allowance up to the input of user data string to the Viterbi detecting circuit 44 is generated and thereby the sync-byte pattern detection probability is not lowered.

Figure 7:
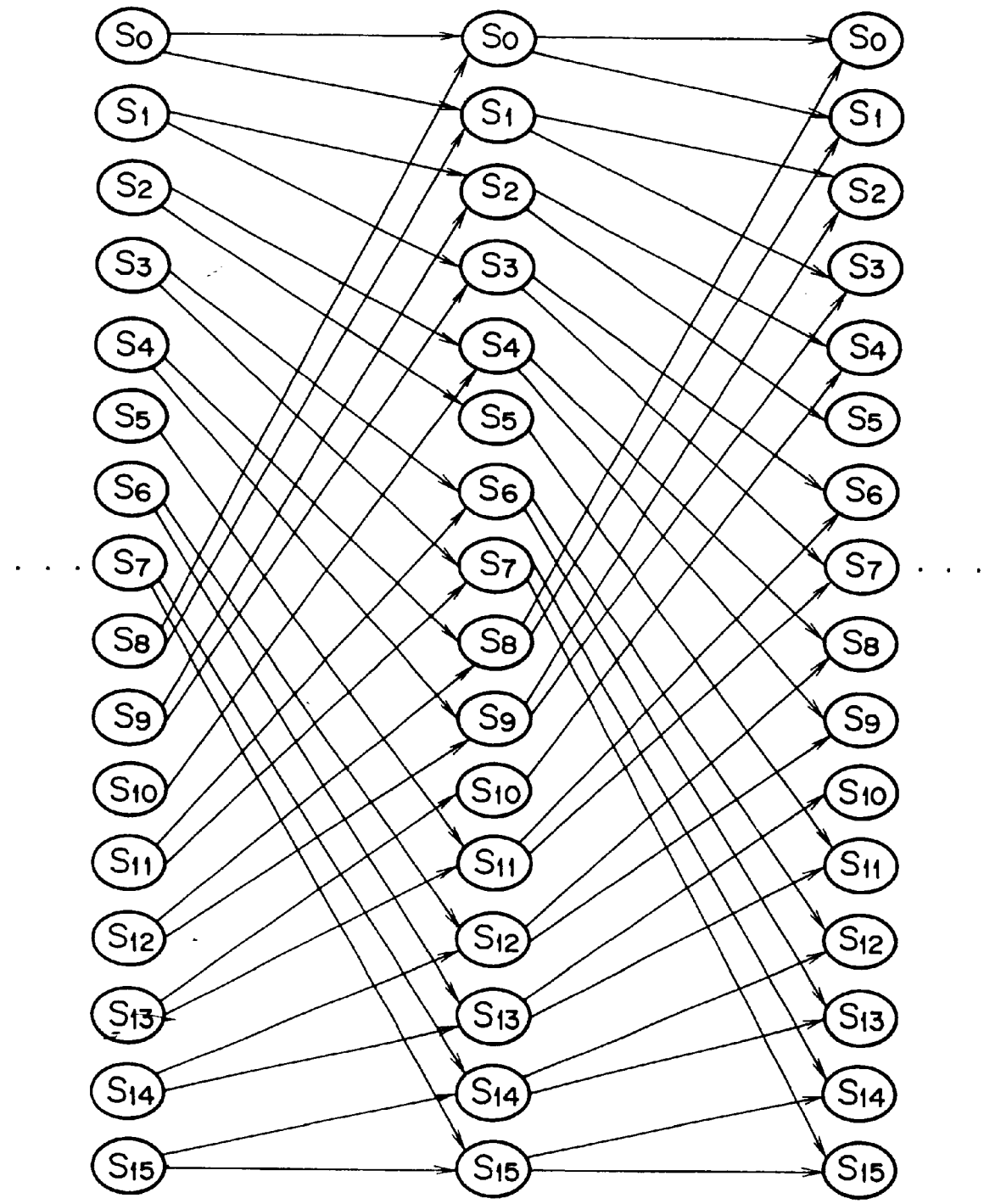
FIG. 7 is a diagram for showing the other example of the trellis diagram of FIG. 5.

Here, the Viterbi detecting circuit 44 may be capable of conducting the Viterbi detection using the trellis structure shown in FIG. 7. In the trellis structure of FIG. 7, transition between the condition S5 and condition S10 is inhibited. The Viterbi detecting circuit 44 using this trellis structure can detect all data sequences including the user data. In this case, it is verified that the minimum code-to-code distance can be assured for only $\sqrt{6}$ for the data sequence other than the sync-byte pattern, but there is no error of code-to-code distance under 6 shown in FIG. 6 for the sync-byte pattern. Namely, detection can be realized in the minimum code-to-code distance of $\sqrt{10}$ or more for the sync-byte pattern.

Figure 8:
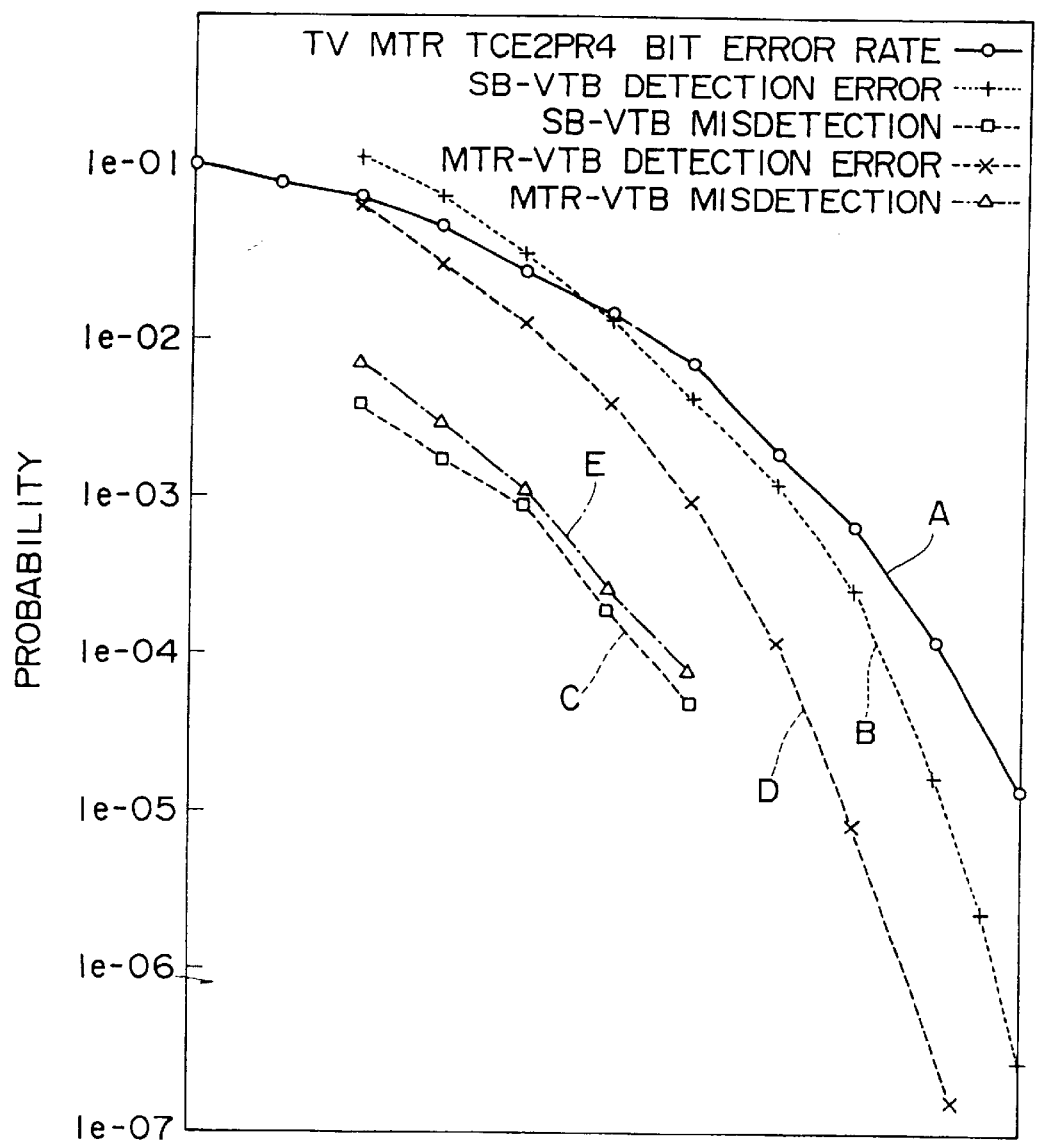
FIG. 8 is a diagram for explaining the simulation result.

FIG. 8 shows simulation result of generation probability of sync-byte erroneous detection error and sync-byte detection error. In this figure, the horizontal axis is plotting S/N ratio (Signal to Noise Ratio) and the vertical axis is plotting probability of each error. A curve A shows a bit error rate for detection of the time varying MTR code (user data) in the code-to-code distance of $\sqrt{10}$. The sync-byte detection error is generated when detection is conducted at the correct position (the natural sync-byte position) and is indicated by the curve B (when detection is conducted using the trellis structure shown in FIG. 7) and the curve D (when detection is conducted using the trellis structure shown in FIG. 5). Moreover, the sync-byte erroneous detection error is generated when sync-byte is detected at the erroneous position (position preceding the natural sync-byte position) and is shown by the curve C (when detection is conducted using the trellis structure shown in FIG. 7) and by the curve E (when detection is conducted using the trellis structure shown in FIG. 5).

As shown in this figure, probability (in the case of the curve B) of the sync-byte erroneous detection error obtained is in the order of $10^{\wedge}(-7)$, for example, when the bit error rate (curve A) during detection of the time varying MTR code is about $10^{\wedge}(-5)$. Moreover, it can also be understood that the sync-byte detection error (curve D) is set up lower than that of the sync-byte detection error (curve B).

In above description, the E2PR4 equalizer is considered as the object, but the present invention can also be applied to the partial response of the E3PR4 or the equalizer of higher class. In addition, the present invention is applied to the digital magnetic disk recording/reproducing apparatus, but it can also be applied to the other information recording/reproducing apparatus and information transmitting apparatus.

As a distribution medium for distributing to users the computer programs to execute the various processes explained above, a communication medium such as the network and satellite can also be used in addition to the recording medium such as magnetic disk, CD-ROM and solid state memory device.

As explained above, according to the information processing apparatus, information processing method and distribution medium of the present invention, since the operation mode is switched to the first mode to perform the detecting operation without relation to the time limitation when the pattern indicating the heading code of the code string is detected and to the second mode to perform the detecting operation depending on the time limitation when the code string is detected, both the code string having time limitation and the sync-byte pattern indicating the heading code of the code string can surely be detected without increase of the circuit scale.

What is claimed is:

1. An information processing apparatus comprising:
   detecting means for detecting a code string encoded depending on a rule including a time limitation;
   adding means for adding a pattern indicating a heading code of said code string to the stage preceding said code string; and
   switching means for switching the operation mode of said detecting means between a first mode to perform the detecting operation without relation to said rule including said time limitation and a second mode to perform the detecting operation depending on said rule including said time limitation, whereby
   said switching means switches the mode of said detecting means to said first mode when said pattern added by said adding means is detected by said detecting means and to said second mode when said code string is detected by said detecting means, whereby
   said pattern added by said adding means provides a Hamming distance of 4 or more between said pattern and a second pattern located at the stage preceding said pattern, and whereby
   said detecting means corrects, at the time of detecting said pattern, an error of a number of bits corresponding to said Hamming distance.

2. An information processing method comprising:
   a detecting step for detecting a code string encoded depending on a rule including a time limitation;
   an adding step for adding a pattern indicating a heading code of said code string to the stage preceding said code string, said pattern added by said adding step providing a Hamming distance of 4 or more between said pattern and a second pattern located at the stage preceding said pattern; and
   a switching step for switching a mode between a first mode to perform the detecting operation without relation to said rule including said time limitation in said detecting step, and a second mode to perform the detecting operation depending on said rule including said time limitation in said detecting step; whereby
   in said switching step, the mode of said detecting step is switched to said first mode when said pattern added in said adding step is detected in said detecting step, and the mode of said detecting step is switched to the second mode when said code string is detected in said detecting step,
   and whereby said detecting step corrects, at the time of detecting said pattern, an error of a number of bits corresponding to said Hamming distance.

3. A recording medium having recorded thereupon a computer-readable program comprising:
   a detecting step for detecting a code string encoded depending on a rule including a time limitation;
   an adding step for adding a pattern indicating a heading code of said code string to the stage preceding said code string; said pattern added by said adding step providing a Hamming distance of 4 or more between said pattern and a second pattern located at the stage preceding said pattern, and
   a switching step for switching a mode of operation between a first mode to perform the detecting operation without relation to said rule including said time limitation in said detecting step, and a second mode to perform the detecting operation depending on said rule including said time limitation in said detecting step; whereby
   in said switching step, the mode of said detecting step is switched to said first mode when said pattern added in said adding step is detected in said detecting step, and is switched to said second mode when said code string is detected in said detecting step;
   and whereby said detecting step corrects, at the time of detecting said pattern, an error of a number of bits corresponding to said Hamming distance.

* * * * *